Figure 1:
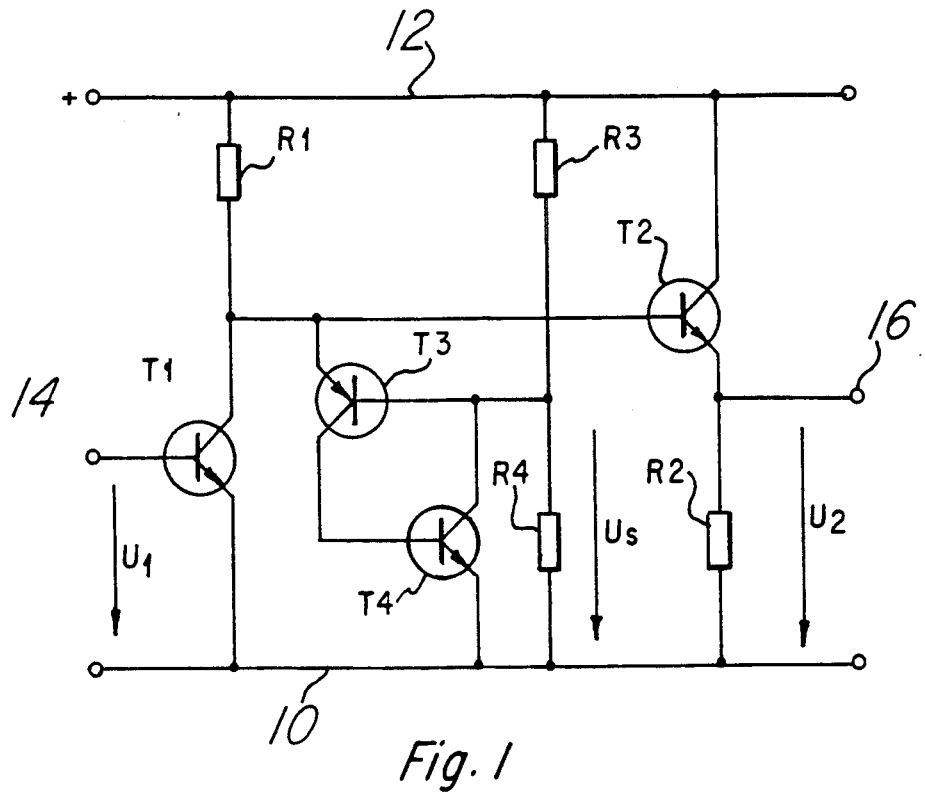

United States Patent
Götz

[11] Patent Number: 5,319,251
[45] Date of Patent: Jun. 7, 1994

[54] CIRCUIT ARRANGEMENT FOR GENERATING A SWITCHING PULSE FROM A SQUARE-WAVE SIGNAL

[75] Inventor: Laszlo Götz, Freising, Fed. Rep. of Germany

[73] Assignee: Texas Instruments Deutschland GmbH, Fed. Rep. of Germany

[21] Appl. No.: 880,953

[22] Filed: May 8, 1992

[30] Foreign Application Priority Data

May 10, 1991 [DE] Fed. Rep. of Germany ....... 4115413

[51] Int. Cl.⁵ ..................... H03K 05/00; H03K 3/284; H03K 17/292
[52] U.S. Cl. .................................. 307/261; 307/268; 307/273; 307/636
[58] Field of Search ............... 307/261, 268, 631, 636, 307/639, 273

[56] References Cited

U.S. PATENT DOCUMENTS

| | | | |
|---|---|---|---|
| 3,633,047 | 1/1972 | Kadah et al. | 307/293 |
| 3,699,360 | 10/1972 | Ragsdale | 307/273 |
| 4,359,655 | 11/1982 | Fukui | 307/636 |
| 4,385,243 | 5/1983 | Suzuki | 307/350 |
| 5,059,817 | 10/1991 | Jolivet | 307/265 |

FOREIGN PATENT DOCUMENTS 2330969 1/1975 Fed. Rep. of Germany.

Primary Examiner—William L. Sikes
Assistant Examiner—Toan Tran
Attorney, Agent, or Firm—William E. Hiller; Richard L. Donaldson

[57] ABSTRACT

A circuit arrangement for generating a switching pulse in dependence upon an edge of a square-wave signal is proposed. The circuit arrangement includes a switch (T1) which is controlled by the square-wave signal and lies in a current path between a supply voltage line (12) and a ground line (10). In parallel with the switch (T1) there is a component (T3, T4) with thyristor behavior which comprises a control connection and changes to the conductive state when the voltage applied thereto is greater than a threshold voltage set at the control connection thereof. With the aid of a coupling element (T2) the voltage present at the component (T3, T4) is transferred to an output terminal (16).

4 Claims, 1 Drawing Sheet

CIRCUIT ARRANGEMENT FOR GENERATING A SWITCHING PULSE FROM A SQUARE-WAVE SIGNAL

The invention relates to a circuit arrangement for generating a switching pulse in dependence upon an edge of a square-wave signal.

In digital circuits it is frequently necessary to scan and evaluate the state of certain digital signals at specific instants. This can be done by means of an edge-triggered D-flip-flop which receives the digital varying signal at a data input and takes on and stores the state of said signal whenever either the positive or the negative edge of a square-wave signal supplied to it as a clock signal occurs. To achieve this edge control, in the input stage of the flip-flop, with high circuit expenditure, from the particular edge of interest a short switching pulse is generated, on the occurrence of which the assumption of the state of the digital signal is then effected in the D-flip-flop. An example of such a D-flip-flop in which this switching pulse is generated in dependence on the edge is explained in the "DATA BOOK", 1989, vol. 1, of the company Texas Instruments, p. 3-234, 3-238. A further possibility of generating the switching pulse resides in providing at the input of such a flip-flop a differentiating stage which is for example so designed that on each negative edge of the clock signal it generates a switching pulse which causes the flip-flop to rake on temporarily the signal state to be stored by switching over to the set or reset state. If in a complex integrated circuit a relatively large number of such flip-flops is present which are each to store the states of selected signals, at a specific instant, i.e. for example under the control of the system clock signal, then for each of said flip-flops a separate complicated input circuit is present which generates the necessary switching pulse from the clock signal. Although the use of a single circuit arrangement in the form of a differentiating RC member would be possible, the switching pulses generated by such a simple differentiating member would depend on the amplitude and the edge steepness of the clock signal and would not always contain with certainty the energy required for triggering one or more flip-flops.

The invention is based on the problem of providing a circuit arrangement of the type outlined at the beginning with the aid of which a very short switching pulse can be generated with very low circuit expenditure independently of the amplitude and the edge steepness of the square-wave signal used for the generation thereof.

According to the invention this problem is solved in a circuit arrangement of the type set forth at the beginning by a switch which is controlled by the square-wave signal and which lies in a current path between a supply voltage line and ground, a component with thyristor behaviour which lies in parallel with said switch, has a control connection and can be put into a conductive state when the voltage across it is greater than a threshold voltage set at its control connection, and changes to a nonconductive state when the current flowing therethrough drops below a predetermined hold current value, and a coupling element which transfers the voltage present at the component to an output terminal.

In the circuit arrangement according to the invention the amplitude of the switching pulse generated does not depend on the amplitude of the square-wave signal because the latter is used only as a control signal for a switch controlling the component with thyristor behaviour which generates the actual desired switching pulse. The circuit arrangement according to the invention can be made up with very few components and it can be employed for triggering a relatively large number of edge-controlled storage elements. Since the threshold voltage of the component with thyristor behaviour is adjustable and the circuit arrangement responds only to edges of one polarity. unintentional generation of switching pulses as a result of interference signals is almost completely impossible. The circuit according to the invention can be used in all cases where from a square-wave signal a short pulse, similar to a needle pulse, is to be generated on occurrence of an edge of said square-wave signal.

Advantageous further developments of the invention are characterized in the subsidiary claims.

Figure 2:
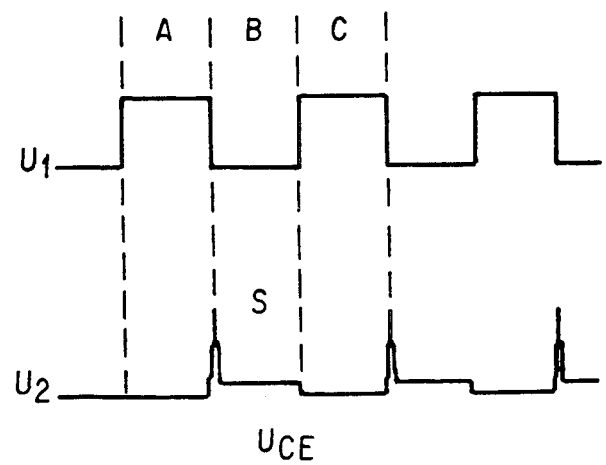

An example of embodiment of the invention will now be explained by way of example with the aid of the drawings, wherein:

FIG. 1 shows a circuit diagram of the circuit arrangement according to the invention and FIG. 2 shows a diagram illustrating the profile of the voltages $U_1$ and $U_2$ at the input and the output of the circuit arrangement of FIG. 1 respectively.

The circuit arrangement of FIG. 1 includes at the input a switch which is formed by an NPN transistor T1, the emitter of which is connected to the line 10 connected to ground and the collector of which is connected via a resistor R1 to the line 12 connected to the positive supply voltage. The base of the transistor T1 forms the input 14 of the circuit arrangement to which a square-wave voltage $U_1$ is applied.

The collector of the transistor T1 is also connected to the base of an NPN transistor T2 which is connected as emitter follower, the collector of which is connected to the line 12 and the emitter of which is connected via a resistor R2 to the line 10. The emitter of this transistor T2 forms simultaneously the output 16 of the circuit arrangement. From the output 16 the voltage $U_2$ can be tapped which contains the desired switching pulse derived from the square-wave signal supplied to the input 14.

The emitter of a PNP transistor T3 is connected to the collector of the transistor T1 and the base of the transistor T2, said transistor T3 forming together with a further NPN transistor T1 a component with thyristor behaviour. As can be seen, in the transistors T3 and T4 the base is connected respectively to the collector of the other transistor. The emitter of the transistor T4 is connected to the line 10 which is connected to ground.

The connection point between the base of the transistor T3 and the collector of the transistor T4 is connected to the connection point of two resistors R3 and R4 which provide a voltage divider between the line 12 and the line 10.

Like a thyristor, the component formed by the transistors T3 and T4 has two switching states, that is a nonconductive state and a conductive state. In the conductive state there is a connection between the emitter of the transistor T3 and the emitter of the transistor T4. The change from the nonconductive state to the conductive state can be achieved when the voltage at the emitter of the transistor T3 is made greater by more than a base emitter voltage $U_{BE}$ than the threshold voltage at the base of the transistor T3 set by means of the resistors R3 and R4. The conductive state can be switched to the nonconductive state only by making the current flowing through the two transistors T3 and 14 smaller than a predetermined small hold current value.

Taking account of the behaviour outlined of the component formed by the transistors T3 and T4, the circuit arrangement illustrated in FIG. 1 behaves as follows:

When the voltage $U_1$ applied to the input 14, which has the profile illustrated in FIG. 2, has a high value, as is the case in the region A, the transistor T1 is conductive so that the voltage at the emitter of the transistor T3 assumes a low value. This low value also appears at the output 16 of the circuit arrangement because the transistor T2 connected as emitter follower fundamentally generates the voltage present at its base at its emitter as well. The resistors R3 and R4 are so chosen that the voltage $U_S$ generated at their connection point is in every case greater than the voltage present at the emitter of the transistor T3 when the voltage at the input 14, i.e. at the base of the transistor T1, has the high value present in the region A. This means that the component formed by the transistors T3 and T4 is in the nonconductive state.

Now, when at the transition from the region A to the region B the voltage $U_1$ assumes a low value the transistor T1 changes to the nonconductive state and as a result the voltage at its collector rises. This voltage rise also manifests itself at the output 16 of the circuit arrangement and leads to the rising edge of the switching pulse S which can be seen in FIG. 2. As soon as the voltage at the collector of the transistor T1 and thus at the emitter of the transistor T3 is greater by the value of a base-emitter voltage than the threshold voltage set at the base of the transistor T3, the component formed by the transistors T3 and T4 "fires" and goes into the conductive state. As a result, the voltage at the base of the transistor T2 breaks down and assumes the value of the collector-emitter voltage $U_{CE}$ which is present in the conductive state of the transistor T4 between the collector and emitter thereof. The breakdown of the voltage produces the negative edge of the switching pulse S. Thus, during the remaining part of the region 8 in the profile of the voltage $U_1$ only the very low voltage $U_{CE}$ is present at the output 16 of the circuit arrangement.

Now, when on the transition from the region B to region C the voltage at the input 14 rises again, the transistor T1 again changes to the conductive state so that current can flow therethrough. The transistor T1 then takes over the current which flowed through the transistors T3 and T4 in the region B so that a current lying below the aforementioned hold current value now flows through said two transistors. Consequently, the transistors T3 and T4 change to the nonconductive state and consequently no longer have any influence on the voltage at the output 16. It is only with the next negative edge of the voltage $U_1$ that a switching pulse S is again generated, because the cycle outlined above then gain takes place.

As is apparent, the amplitude of the switching pulse S generated does not depend on the magnitude of the input voltage $U_1$. By fixing the threshold voltage with the aid of the resistors R3 and R4 the triggering point for generation of the switching pulse S can be exactly set, thus making it possible to prevent interference signals of low amplitude leading to generation of a switching pulse. Since bipolar transistors are used, the circuit arrangement can be employed for high voltages. Since it consists only of a few components it can be implemented in integrated circuits at very low cost.

I claim:

1. A circuit for generating a switching pulse in dependence upon an edge of a square-wave voltage signal, said circuit comprising:
   an input terminal for receiving a square-wave voltage input signal;
   an input bipolar transistor having base, collector, and emitter electrodes;
   said input terminal being connected to the base of said input bipolar transistor;
   a supply voltage line;
   the collector of said input bipolar transistor being connected to said supply voltage line;
   an output terminal for providing an output signal;
   an output bipolar transistor having base, collector, and emitter electrodes;
   the base and the emitter of said output bipolar transistor being connected to the collector of said input bipolar transistor and to said output terminal respectively;
   a circuit component exhibiting thyristor behavior interposed between said input and output bipolar transistors;
   said thyristor-behaving circuit component being coupled across the collector and emitter of said input bipolar transistor and being coupled to the base of said output bipolar transistor; and
   said thyristor-behaving circuit component having a control connection set at a predetermined threshold voltage and being conductive when the voltage across the thyristor-behaving circuit component exceeds the predetermined threshold voltage at the control connection thereof;
   the voltage at the base of said output bipolar transistor dropping and said output bipolar transistor providing a collector-emitter voltage to said output terminal in response to said thyristor-behaving circuit component being rendered conductive to produce a switching pulse at said output terminal having an amplitude independent of the magnitude of the square-wave voltage input signal.

2. A circuit as set forth in claim 1, wherein said thyristor-behaving circuit component comprises first and second bipolar transistors respectively having base, collector, and emitter electrodes, the base of said first transistor and the collector of said second transistor of said thyristor-behaving circuit component being connected to said control connection thereof;
   the collector of said first transistor being connected to the base of said second transistor of said thyristor-behaving circuit component; and
   the emitters of said first and second transistors of said thyristor-behaving circuit component being respectively connected to the collector and the emitter of said input bipolar transistor.

3. A circuit as set forth in claim 1, further including first and second resistors connected to said control connection of said thyristor-behaving circuit component and being disposed on opposite sides thereof in respective connection to said supply voltage line and to ground, said first and second resistors defining a voltage divider and setting the voltage at said control connection of said thyristor-behaving circuit component at the predetermined threshold voltage.

4. A circuit as set forth in claim 1, wherein said output bipolar transistor is connected as an emitter follower with the base thereof having the voltage from said thyristor-behaving circuit component applied thereto.

* * * * *